US012685155B2

(12) United States Patent
Su et al.

(10) Patent No.: US 12,685,155 B2
(45) Date of Patent: Jul. 14, 2026

(54) ELECTRONIC PACKAGE AND SUBSTRATE STRUCTURE THEREOF

(71) Applicant: SILICONWARE PRECISION INDUSTRIES CO., LTD., Taichung City (TW)

(72) Inventors: Pin-Jing Su, Taichung City (TW); Wen-Yu Teng, Taichung City (TW); Liang-Yi Hung, Taichung City (TW); Chia-Cheng Chen, Taichung City (TW); Yu-Po Wang, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 372 days.

(21) Appl. No.: 18/357,596

(22) Filed: Jul. 24, 2023

(65) Prior Publication Data

US 2024/0363577 A1 Oct. 31, 2024

(30) Foreign Application Priority Data

Apr. 28, 2023 (TW) ................................. 112116072

(51) Int. Cl.
H01L 23/00 (2006.01)
H01L 23/367 (2006.01)
(Continued)

(52) U.S. Cl.
CPC ...... H10W 40/22 (2026.01); H10W 72/07351 (2026.01); H10W 72/365 (2026.01);
(Continued)

(58) Field of Classification Search
CPC ......... H01L 24/32; H01L 24/16; H01L 24/33; H01L 24/73; H01L 23/3675; H01L 2224/16225; H01L 2224/26145; H01L 2224/32225; H01L 2224/32245; H01L 2224/33519; H01L 2224/73204; H01L 2224/73253; H01L 2924/1611; H01L 2924/16235; H01L 2924/1632; H10W 40/22; H10W 72/877; H10W 72/367; H10W 72/365; H10W 72/07351; H10W 72/387; H10W 74/15; H10W 90/724; H10W 90/734; H10W 90/736
See application file for complete search history.

(56) References Cited

U.S. PATENT DOCUMENTS 8,710,643 B2 * 4/2014 Kang .................... H01L 21/563
438/108
2011/0095421 A1 * 4/2011 Kim ...................... H01L 21/563
257/E21.511

(Continued)

*Primary Examiner* — Peniel M Gumedzoe
(74) *Attorney, Agent, or Firm* — Studebaker Brackett PLLC

(57) ABSTRACT

An electronic package and a substrate structure thereof are provided, in which an electronic element and a flow stopper surrounding the electronic element are disposed on a substrate body of the substrate structure, and a heat dissipation structure is bonded on the electronic element via a heat dissipation material, so that the flow stopper limits an overflow range of the heat dissipation material to prevent the heat dissipation material from contaminating a circuit layer on the substrate body.

15 Claims, 6 Drawing Sheets

(51) Int. Cl.

| | |
|---|---|
| *H10W 40/22* | (2026.01) |
| *H10W 72/00* | (2026.01) |
| *H10W 72/30* | (2026.01) |
| *H10W 74/15* | (2026.01) |
| *H10W 76/10* | (2026.01) |
| *H10W 76/63* | (2026.01) |
| *H10W 90/00* | (2026.01) |

(52) U.S. Cl.
  CPC ........ *H10W 72/367* (2026.01); *H10W 72/387* (2026.01); *H10W 72/877* (2026.01); *H10W 74/15* (2026.01); *H10W 76/10* (2026.01); *H10W 76/63* (2026.01); *H10W 90/724* (2026.01); *H10W 90/734* (2026.01); *H10W 90/736* (2026.01)

(56) References Cited

U.S. PATENT DOCUMENTS

| | | | |
|---|---|---|---|
| 2011/0260338 A1* | 10/2011 | Lee ................... | H01L 23/49811 |
| | | | 257/E21.511 |
| 2014/0160688 A1* | 6/2014 | Lu ..................... | H01L 23/49816 |
| | | | 361/728 |
| 2024/0162113 A1* | 5/2024 | Park ........................ | H01L 23/42 |

* cited by examiner

ELECTRONIC PACKAGE AND SUBSTRATE STRUCTURE THEREOF

BACKGROUND

1. Technical Field

The present disclosure relates to a package structure, and more particularly, to an electronic package and a substrate structure thereof.

2. Description of Related Art

With the improvement of the function and processing speed of electronic products, semiconductor chips, which are the core components of electronic products, need to have higher density electronic elements and electronic circuits, so the semiconductor chip will generate a larger amount of heat energy during operation. Furthermore, since the conventional encapsulant covering the semiconductor chip is made of a poor heat transfer material with a thermal conductivity of merely 0.8 watts/(meter·Kelvin) (i.e., the heat dissipation efficiency is not good), it will cause damage to the semiconductor chip and product reliability problems when the heat generated by the semiconductor chip cannot be effectively dissipated.

In order to quickly dissipate heat to the outside, a heat sink or a heat spreader is usually configured in the semiconductor package in the industry. The heat sink is usually bonded to the back of the semiconductor chip via the thermal glue (such as thermal interface material [TIM]), so that the heat generated by the semiconductor chip is dissipated by the thermal glue and the heat sink. Moreover, a top surface of the heat sink is usually exposed from the encapsulant or directly exposed to the atmosphere to obtain better heat dissipation effect.

As shown in FIG. 1, in a conventional semiconductor package 1, a semiconductor chip 11 is flip-chip disposed (i.e., via conductive bumps 110 and an underfill 111) on a package substrate 10 having a circuit layer 100 with an active surface 11a of the semiconductor chip 11, a heat sink 13 is then bonded onto an inactive surface 11b of the semiconductor chip 11 via a TIM layer 12 with a top sheet 130 of the heat sink 13, and supporting legs 131 of the heat sink 13 are erected on the package substrate 10 via an adhesive layer 14.

Moreover, in order to catch up with the development trend of electronic products towards multi-contact (I/O), large-size packaging specifications, large area and high heat dissipation, fluid such as liquid metal is used to make the TIM layer 12 in the industry, so as to replace the conventional hard material TIM layer.

During operation, the heat energy generated by the semiconductor chip 11 is conducted to the top sheet 130 of the heat sink 13 via the inactive surface 11b and the TIM layer 12 to dissipate heat to the outside of the semiconductor package 1.

However, if the TIM layer 12 is a fluid, it will expand in a molten state at high temperature, so that it cannot be stably laid on the inactive surface 11b of the semiconductor chip 11, and thus overflows onto the package substrate 10, such that the circuit layer 100 on the surface of the package substrate 10 is polluted and may even be bridged and short-circuited.

Furthermore, during the operation of electronic products, insufficient TIM is likely occurred between the inactive surface 11b of the semiconductor chip 11 and the top sheet 130 of the heat sink 13 due to excessive overflow of the TIM layer 12. As a result, the heat dissipation capability of the semiconductor package 1 is greatly reduced, so that the heat dissipation effect of electronic products is poor, thereby causing overheating of the semiconductor package 1 and damage to electronic products.

Therefore, there is a need for a solution that addresses the aforementioned shortcomings in the prior art.

SUMMARY

In view of the aforementioned shortcomings of the prior art, the present disclosure provides a substrate structure, which comprises: a substrate body having a first side and a second side opposing the first side, a packaging area, a concentrating area adjacent to the packaging area and a functional area adjacent to the concentrating area being defined on the first side, wherein the first side has a circuit layer formed thereon, and the circuit layer has a plurality of conductive parts located on the functional area; and a flow stopper disposed on the concentrating area of the first side of the substrate body.

In the aforementioned substrate structure, the packaging area is surrounded by the flow stopper.

In the aforementioned substrate structure, the flow stopper has a discontinuous ring shape.

In the aforementioned substrate structure, the flow stopper is a continuous ring.

In the aforementioned substrate structure, the flow stopper is a protrusion disposed on the first side of the substrate body.

In the aforementioned substrate structure, the flow stopper is a wall-shaped insulator.

In the aforementioned substrate structure, the flow stopper comprises a plurality of dams separated from each other, and a gap is formed between adjacent ones of the dams. For example, an arrangement of the plurality of dams corresponds to positions of the plurality of conductive parts.

In the aforementioned substrate structure, the flow stopper is a recess formed on the first side of the substrate body.

In the aforementioned substrate structure, the flow stopper is located at a boundary of the concentrating area and the packaging area.

The present disclosure also provides an electronic package, which comprises: the aforementioned substrate structure; an electronic element disposed on the packaging area of the first side of the substrate body and electrically connected to the circuit layer; and a heat dissipation structure bonded on the electronic element via a heat dissipation material.

In the aforementioned electronic package, the electronic element is electrically connected to the circuit layer via a plurality of conductive bumps. The present disclosure further comprises a cladding layer formed on the first side of the substrate body and covering the plurality of conductive bumps. For example, the cladding layer is adjacent to the flow stopper.

In the aforementioned electronic package, the heat dissipation material is used as a thermal interface material.

In the aforementioned electronic package, the heat dissipation material is further formed on the concentrating area.

In the aforementioned electronic package, the heat dissipation structure is a heat sink.

In the aforementioned electronic package, the heat dissipation structure comprises a sheet-shaped heat dissipation body and a plurality of supporting legs erected on the heat dissipation body, wherein the heat dissipation body is in contact with and bonded to the heat dissipation material, and the plurality of supporting legs are disposed on the plurality of conductive parts. For example, the plurality of supporting legs are disposed on the plurality of conductive parts via a plurality of conductive elements.

In the aforementioned electronic package, the present disclosure further comprises a plurality of conductive elements disposed on the plurality of conductive parts.

As can be understood from the above, in the electronic package and the substrate structure thereof according to the present disclosure, the overflow range of the heat dissipation material is limited in the concentrating area due to the design of the flow stopper on the first side of the substrate body. Therefore, compared with the prior art, the electronic package of the present disclosure can prevent the heat dissipation material from overflowing to the functional area, so as to prevent the heat dissipation material from contaminating the conductive parts, and thus effectively avoiding the problem of bridging between the conductive parts and also avoiding the problem of short circuit.

Furthermore, the flow stopper is located at the boundary of the concentrating area and the packaging area to reduce the overflow of the heat dissipation material, so that the problem of insufficient TIM between the electronic element and the heat dissipation structure due to excessive overflow of the heat dissipation material may be avoided. Therefore, compared with the prior art, the electronic package of the present disclosure can maintain the required heat dissipation capacity, so that the heat dissipation effect of electronic products meets the requirements to avoid the damage of the electronic products due to overheating of the electronic package.

BRIEF DESCRIPTION OF THE DRAWINGS

FIG. 2A-1, FIG. 2B, FIG. 2C and FIG. 2D are schematic cross-sectional views illustrating a manufacturing method of an electronic package of the present disclosure.

FIG. 2A-2 and FIG. 2A-3 are schematic top views showing different aspects of FIG. 2A-1.

FIG. 3 is a schematic cross-sectional view showing another embodiment of FIG. 2D.

DETAILED DESCRIPTION

Figure 1:
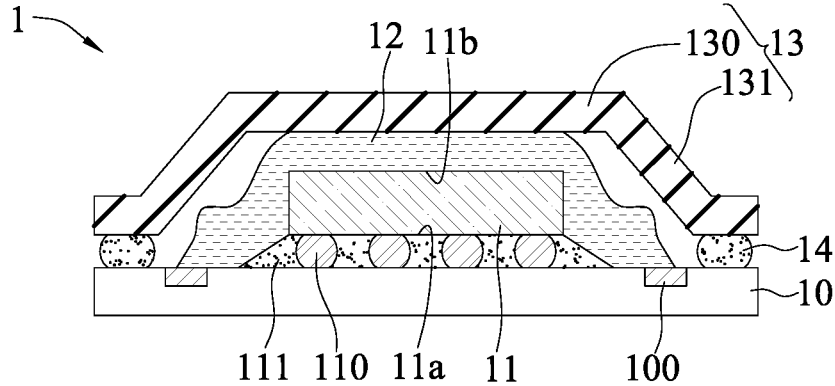
FIG. 1 is a schematic cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "first," "second," "a," "one," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A-1, FIG. 2B, FIG. 2C and FIG. 2D are schematic cross-sectional views illustrating a manufacturing method of an electronic package 2 of the present disclosure.

Figures 1, 2A:
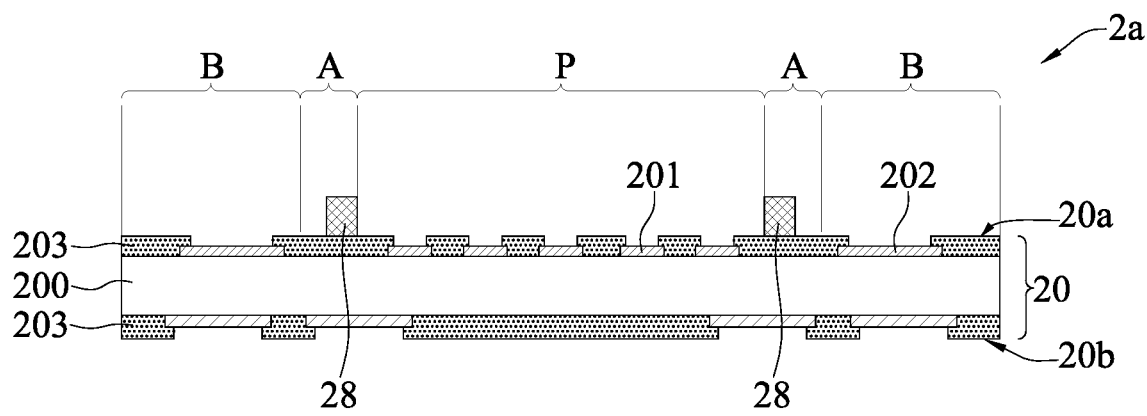

As shown in FIG. 2A-1, a substrate structure 2a is provided, which comprises a substrate body 20 and at least one flow stopper 28 disposed on the substrate body 20.

The substrate body 20 has a first side 20a and a second side 20b opposing the first side 20a, so that a packaging area P, a concentrating area A adjacent to the packaging area P and a functional area B adjacent to the concentrating area A are defined on the first side 20a, such that the concentrating area A is located between the packaging area P and the functional area B.

In an embodiment, the substrate body 20 may be a package substrate with a core layer and a circuit portion or a coreless circuit structure. For example, the substrate body 20 includes a dielectric body 200 and a circuit layer 201 bonded to the dielectric body 200, such as a fan-out redistribution layer (RDL) specification.

Moreover, the circuit layer 201 on the first side 20a of the substrate body 20 is arranged on the packaging area P and the concentrating area A and has a plurality of conductive parts 202 located in the functional area B, such as electrical contact pads (which can be used to connect with electronic elements or non-electronic elements), so as to form an insulating protective layer 203 such as a solder-resist layer on the first side 20a and the second side 20b, so that partial surfaces of the circuit layer 201 of the packaging area P, the conductive parts 202 and the circuit layer 201 of the second side 20b are respectively exposed from the insulating protective layer 203, while the circuit layer 201 of the concentrating area A is not exposed from the insulating protective layer 203.

Also, the first side 20a of the substrate body 20 is used as a die placement side for carrying elements in chip specification, and the second side 20b of the substrate body 20 is used as the ball placement side to place a plurality of solder materials such as solder balls (not shown) thereon for connecting an electronic device such as a circuit board (not shown). It should be understood that the substrate body 20 may also be other carrying units capable of carrying chips, such as a silicon interposer, but not limited to the above.

The flow stopper 28 is disposed on the concentrating area A of the first side 20a of the substrate body 20.

Figures 2, 2A:
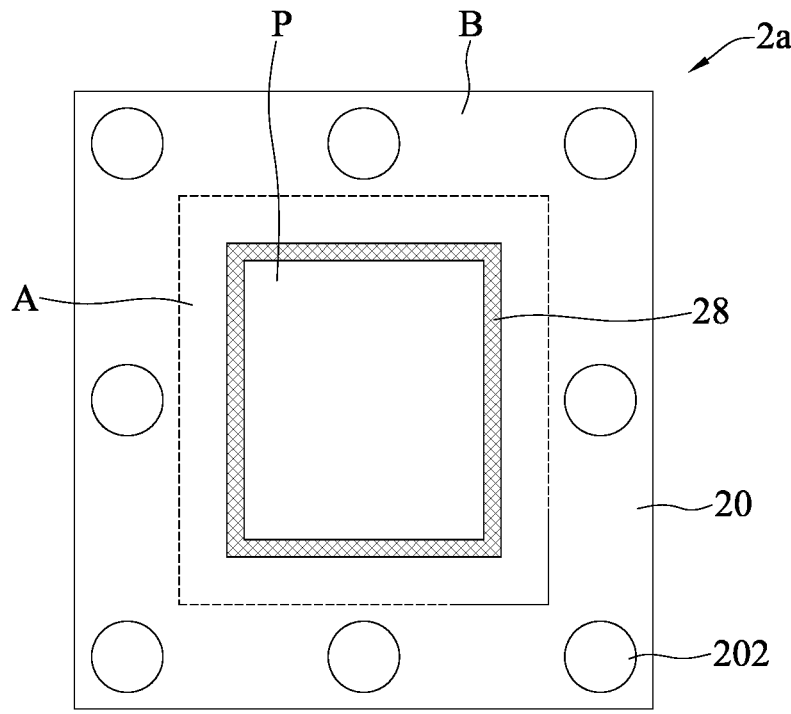
Figure 4:
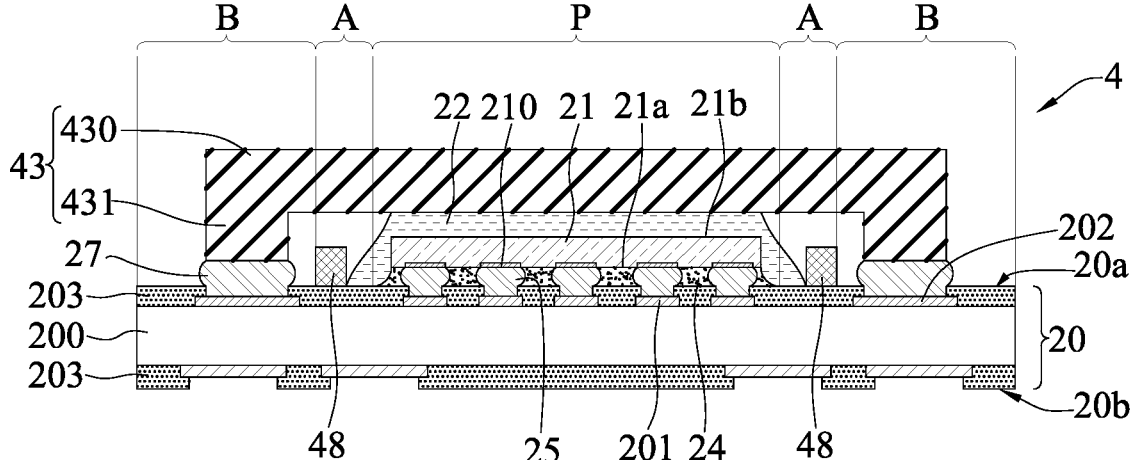
FIG. 4 is a schematic cross-sectional view showing yet another embodiment of FIG. 2D.

In an embodiment, the flow stopper 28 is a protrusion disposed on the first side 20a of the substrate body 20, such as a wall-shaped insulator, which surrounds the packaging area P, as shown in FIG. 2A-2. For example, the flow stopper 28 is formed by dispensing glue to form a continuous ring (as shown in FIG. 2A-2), or a flow stopper 48 as shown in FIG. 4.

Figures 2, 2A, 3:
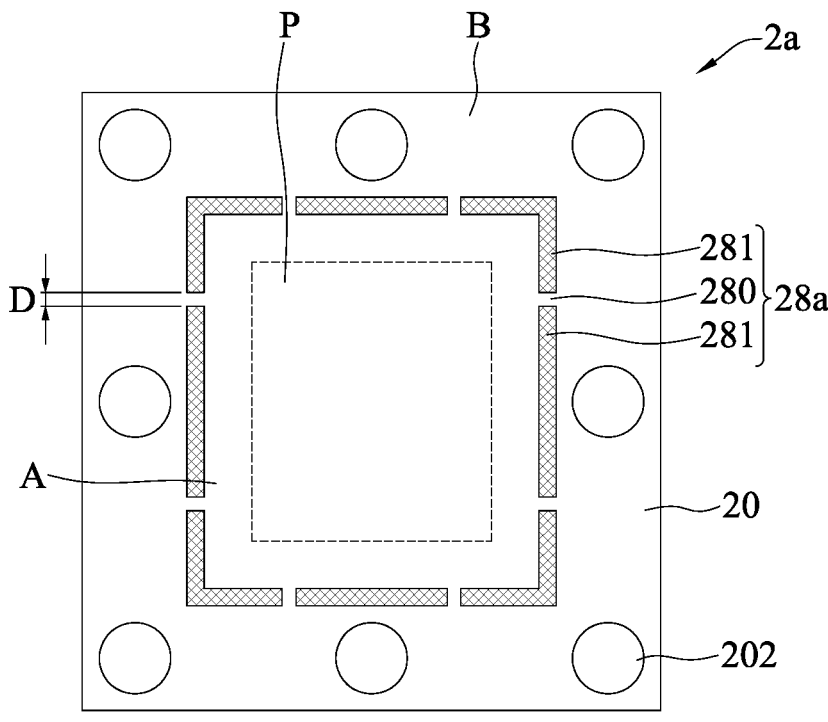

Furthermore, as shown in FIG. 2A-3, a flow stopper 28a can also be formed by dispensing glue to form a plurality of dams 281 separated from each other, so that a gap 280 is formed between each of the dams 281 (e.g., between adjacent ones of the dams 281), so that the flow stopper 28a has a discontinuous ring shape, and the arrangement of each of the dams 281 corresponds to the position of each of the conductive parts 202, so that the position of a single dam 281 corresponds to the position of a single conductive part 202.

For example, as shown in FIG. 2A-3, the positions of the eight dams 281 correspond to the positions of the eight conductive parts 202.

It should be understood that there is no particular limitation to the shape of the flow stopper 28, 28a, as long as the flow stopper 28, 28a corresponds to the positions of the conductive parts 202.

In another embodiment, in an electronic package 3 shown in FIG. 3, a flow stopper 38 can also be a recess on the first side 20a of the substrate body 20 and surrounding the packaging area P. For instance, the recess can be formed only in the insulating protective layer 203 (not shown); or, the recess can even extend into the dielectric body 200; or, the recess can be formed only in the dielectric body 200, and then the insulating protective layer 203 is laid on the dielectric body 200 (not shown).

Also, the flow stopper 28 is located at the boundary of the concentrating area A and the packaging area P, as shown in FIG. 2A-2; or, the flow stopper 28a, 48 is located at the boundary of the concentrating area A and the functional area B, as shown in FIG. 2A-3 or FIG. 4; or, the flow stopper 38 is located within the concentrating area A and not adjacent to the packaging area P or the functional area B, as shown in FIG. 3. It should be understood that the position of the flow stopper 28, 28a, 38, 48 can be arranged anywhere in the concentrating area A according to requirements, but not limited to the above.

Figure 2B:
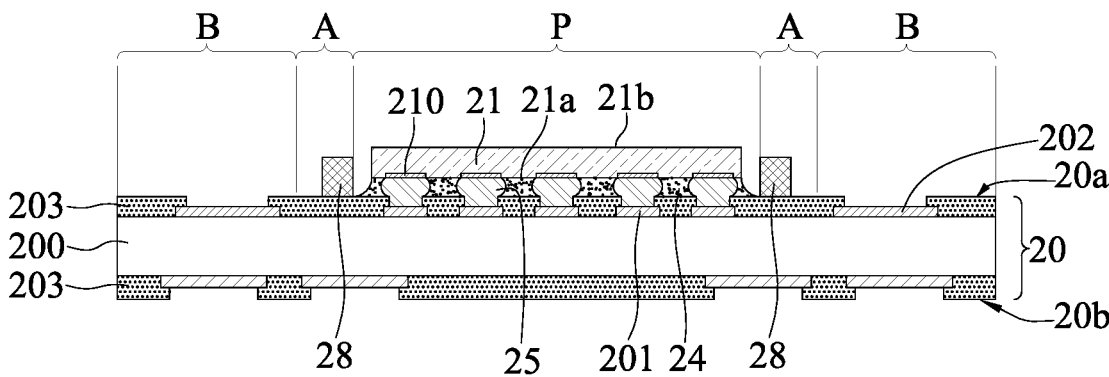

As shown in FIG. 2B, at least one electronic element 21 is disposed on the packaging area P of the first side 20a of the substrate body 20, such that the flow stopper 28 surrounds the electronic element 21.

The electronic element 21 is an active element, a passive element, or a combination of the active element and the passive element, wherein the active element may be a semiconductor chip, and the passive element may be a resistor, a capacitor, or an inductor.

In an embodiment, the electronic element 21 is a semiconductor chip and has an active surface 21a and an inactive surface 21b opposing the active surface 21a, and a plurality of electrode pads 210 are formed on the active surface 21a, so that the electrode pads 210 are bonded with and electrically connected to the circuit layer 201 of the substrate body 20 via a plurality of conductive bumps 25 such as solder materials in a flip-chip manner, and then a cladding layer 24 such as an underfill is filled and formed between the first side 20a of the substrate body 20 and the active surface 21a of the electronic element 21 to cover the conductive bumps 25.

Furthermore, the cladding layer 24 is formed in the packaging area P, and the boundary of the cladding layer 24 can be located at the boundary of the packaging area P, or even extend into the concentrating area A according to requirements.

In other embodiments, the electronic element 21 can directly contact the circuit layer 201 of the substrate body 20.

It should be understood that there are many ways to electrically connect the electronic element 21 to the substrate body 20, and the required type and quantity of the electronic element 21 that can be disposed on the substrate body 20 are not limited to the above.

Figure 2C:
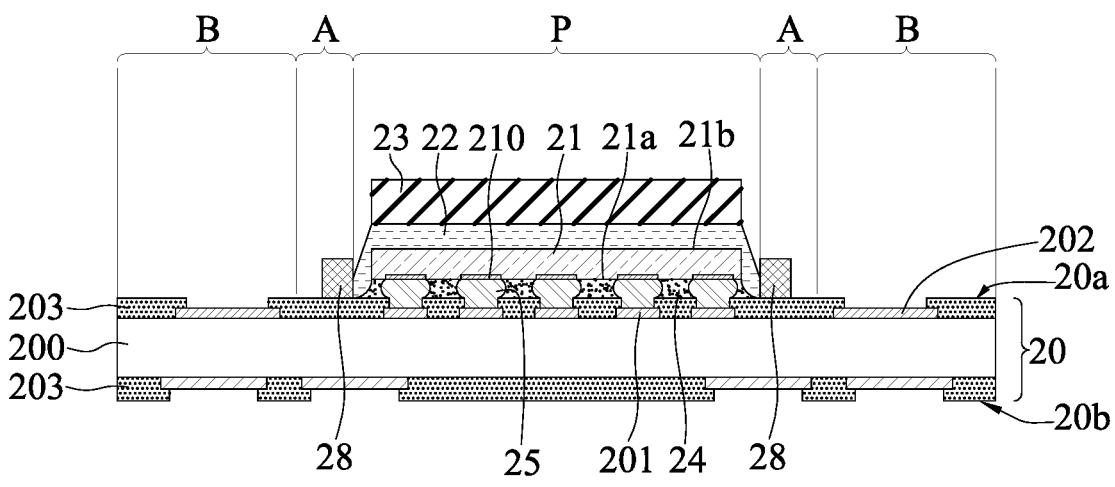

As shown in FIG. 2C, a heat dissipation structure 23 is bonded on the inactive surface 21b of the electronic element 21 via a heat dissipation material 22.

The heat dissipation material 22 is formed on and in contact with the inactive surface 21b of the electronic element 21, and the heat dissipation material 22 has a high thermal conductivity of about 30 to 80 watts/(meter·Kelvin) and serves as a thermal interface material (TIM).

In an embodiment, the heat dissipation material 22 is a fluid, such as liquid metal, solder material, silicone material, ultraviolet (UV) gel material, or other molten materials. It should be understood that there are various kinds of fluid TIMs, but not limited to the above.

The heat dissipation structure 23 is a heat sink, such as a copper sheet, which is pressed on the heat dissipation material 22.

In an embodiment, the heat dissipation material 22 overflows from the inactive surface 21b of the electronic element 21 and is stopped by the flow stopper 28, so that the heat dissipation material 22 does not spread to the concentrating area A.

In other embodiments, as shown in FIG. 3, the heat dissipation material 22 overflows to the concentrating area A and flows into the flow stopper 38 (recess); or, as shown in FIG. 4, the heat dissipation material 22 overflows to the concentrating area A and is stopped by the flow stopper 48, such that the heat dissipation material 22 does not spread to the functional area B.

Figure 2D:
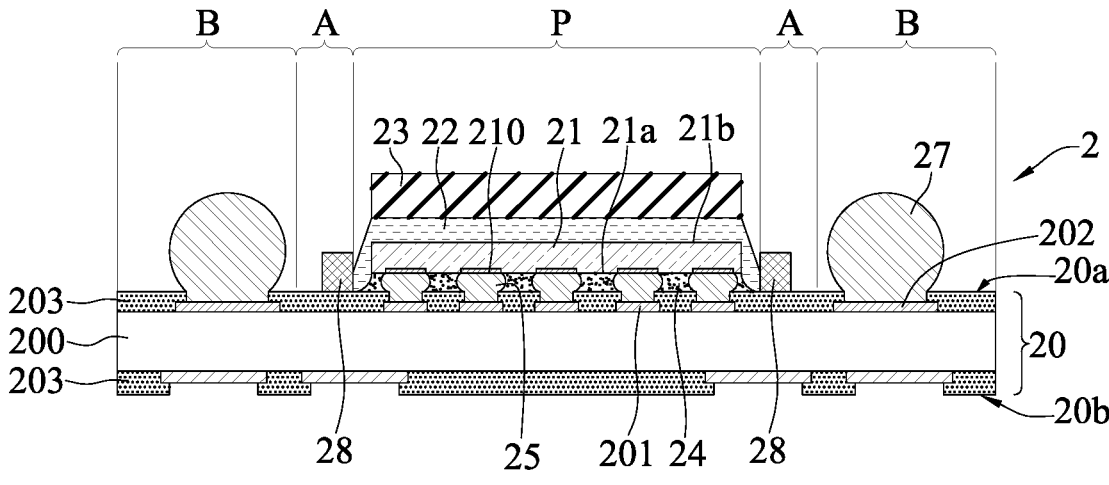
Figure 3:
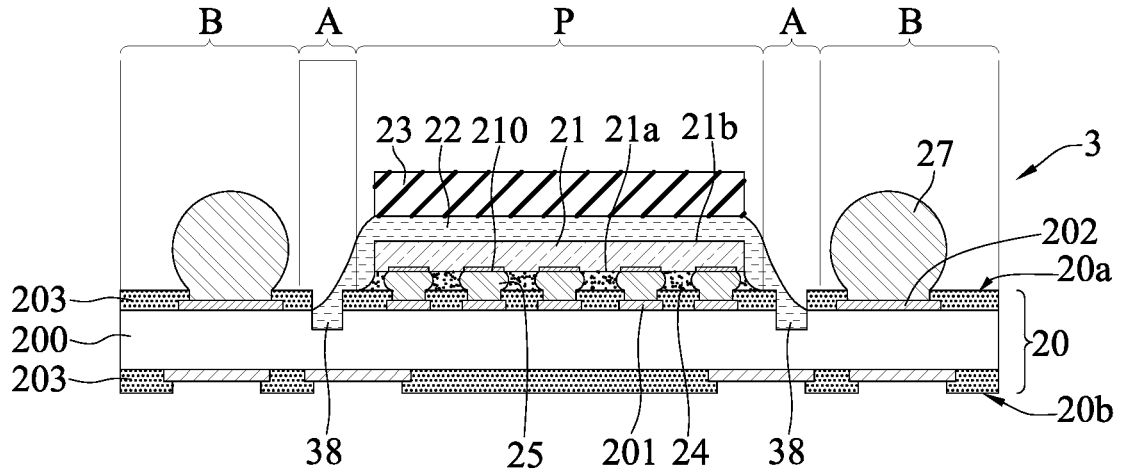

As shown in FIG. 2D, conductive elements 27 are disposed on the conductive parts 202 of the substrate body 20.

In an embodiment, the conductive elements 27 are solder bumps or metal pillars such as copper pillars, so that an electronic device (not shown) such as a package or another package substrate is stacked and connected via the conductive elements 27.

In another embodiment, in an electronic package 4 shown in FIG. 4, the conductive elements 27 can also be connected with a heat dissipation structure 43. For example, the heat dissipation structure 43 comprises a sheet-shaped heat dissipation body 430 and a plurality of supporting legs 431 erected on the heat dissipation body 430, so that the heat dissipation body 430 is in contact with and bonded to the heat dissipation material 22, and the supporting legs 431 are bonded to the conductive elements 27. It should be understood that the conductive elements 27 can also be replaced by an adhesive material such as conductive paste or insulation glue (such as the adhesive layer 14 shown in FIG. 1) on the conductive parts 202 to adhere and fix the supporting legs 431.

Therefore, in the electronic package 2, 3, 4 of the present disclosure, the substrate body 20 has the flow stopper 28, 28a, 38, 48, so that the heat dissipation material 22 is stopped by the wall-shaped flow stopper 28, 28a, 48 or is accumulated by the recess-shaped flow stopper 38, such that the flow stopper 28, 28a, 38, 48 can limit the overflow range of the heat dissipation material 22 in the concentrating area A, that is, the heat dissipation material 22 can only overflow in the concentrating area A and cannot spread to the functional area B. Therefore, compared with the prior art, the electronic package 2, 3, 4 of the present disclosure can prevent the heat dissipation material 22 from overflowing to the functional area B and contaminating the conductive parts 202. Thus, the present disclosure can effectively prevent the problem of bridging from occurring between the conductive parts 202, thereby avoiding the problem of short circuit, so that the conductive parts 202 can be successfully bonded to the conductive elements 27 or other operations can be performed in the subsequent processes.

Furthermore, if a width D of the gap 280 of the flow stopper 28a is small enough, the heat dissipation material 22 cannot flow through the gap 280 due to its viscosity, the flow stopper 28a can still limit the overflow range of the heat dissipation material 22 within the concentrating area A, so as to prevent the heat dissipation material 22 from contaminating the conductive parts 202.

Also, if the flow stopper 28 is located at the boundary of the concentrating area A and the packaging area P, as shown in FIG. 2A-2 or FIG. 2D, the flow stopper 28 will be adjacent to the cladding layer 24, so that the overflow of the heat dissipation material 22 can be greatly reduced by the flow stopper 28 to avoid insufficient TIM between the inactive surface 21b of the electronic element 21 and the heat dissipation structure 23 (or the heat dissipation body 430) due to excessive overflow of the heat dissipation material 22. Therefore, compared with the prior art, the electronic package 2 of the present disclosure can maintain the required heat dissipation capacity, so that the heat dissipation effect of electronic products meets the requirements to avoid the damage of the electronic products due to overheating of the electronic package 2.

It should be understood that if the cladding layer 24 extends into the concentrating area A, other positions of the flow stopper 28a, 38, 48 located in the concentrating area A may also be adjacent to the cladding layer 24.

The present disclosure provides an electronic package 2, 3, 4, which comprises: a substrate structure 2a including a substrate body 20 and at least one flow stopper 28, 28a, 38, 48, at least one electronic element 21 disposed on the substrate body 20, and a heat dissipation structure 23, 43 bonded onto the electronic element 21 via a heat dissipation material 22.

The substrate body 20 has a first side 20a and a second side 20b opposing the first side 20a, so that a packaging area P, a concentrating area A adjacent to the packaging area P and a functional area B adjacent to the concentrating area A are defined on the first side 20a, wherein a circuit layer 201 is formed on the first side 20a, and the circuit layer 201 has a plurality of conductive parts 202 located on the functional area B.

The flow stopper 28, 28a, 38, 48 is disposed on the concentrating area A of the first side 20a of the substrate body 20.

The electronic element 21 is disposed on the packaging area P of the first side 20a of the substrate body 20 to electrically connect to the circuit layer 201.

In one embodiment, the packaging area p is surrounded by the flow stopper 28, 28a, 38, 48.

In one embodiment, the flow stopper 28a has a discontinuous ring shape.

In one embodiment, the flow stopper 28, 48 is a continuous ring.

In one embodiment, the flow stopper 28, 28a, 48 is a protrusion disposed on the first side 20a of the substrate body 20.

In one embodiment, the flow stopper 28, 28a, 48 is a wall-shaped insulator.

In one embodiment, the flow stopper 28a comprises a plurality of dams 281 separated from each other, so that a gap 280 is formed between adjacent ones of the dams 281. For example, an arrangement of the plurality of dams 281 corresponds to positions of the plurality of conductive parts 202.

In one embodiment, the flow stopper 38 is a recces formed on the first side 20a of the substrate body 20.

In one embodiment, the flow stopper 28 is located at a boundary of the concentrating area A and the packaging area P.

In one embodiment, the electronic element 21 is electrically connected to the circuit layer 201 via a plurality of conductive bumps 25. Further, a cladding layer 24 covering the plurality of conductive bumps 25 is formed on the first side 20a of the substrate body 20. For example, the cladding layer 24 is adjacent to the flow stopper 28.

In one embodiment, the heat dissipation material 22 is used as a thermal interface material (TIM).

In one embodiment, the heat dissipation material 22 is further formed on the concentrating area A.

In one embodiment, the heat dissipation structure 23 is a heat sink.

In one embodiment, the heat dissipation structure 43 comprises a sheet-shaped heat dissipation body 430 and a plurality of supporting legs 431 erected on the heat dissipation body 430, wherein the heat dissipation body 430 is in contact with and bonded to the heat dissipation material 22, and the supporting legs 431 are disposed on the conductive parts 202. For example, the supporting legs 431 are disposed on the conductive parts 202 via conductive elements 27.

In one embodiment, the electronic package 2, 3, 4 further comprises a plurality of conductive elements 27 formed on the plurality of conductive parts 202.

In view of the above, in the electronic package and the substrate structure thereof of the present disclosure, the overflow range of the heat dissipation material is limited in the concentrating area due to the design of the flow stopper on the first side of the substrate body. Therefore, the electronic package of the present disclosure can prevent the heat dissipation material from overflowing to the functional area, so as to prevent the heat dissipation material from contaminating the conductive parts, and thus effectively avoiding the problem of bridging between the conductive parts and also avoiding the problem of short circuit.

Furthermore, the flow stopper is located at the boundary of the concentrating area and the packaging area to reduce the overflow of the heat dissipation material, so that the problem of insufficient TIM between the electronic element and the heat dissipation structure due to excessive overflow of the heat dissipation material may be avoided. Therefore, the electronic package of the present disclosure can maintain the required heat dissipation capacity, so that the heat dissipation effect of electronic products meets the requirements to avoid the damage of the electronic products due to overheating of the electronic package.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A substrate structure, comprising:
a substrate body having a first side and a second side opposing the first side, a packaging area, a concentrating area adjacent to the packaging area and a functional area adjacent to the concentrating area being defined on the first side, wherein the first side has a circuit layer formed thereon, and the circuit layer has a plurality of conductive parts located on the functional area; and
a flow stopper disposed on the concentrating area of the first side of the substrate body, wherein the flow stopper has a discontinuous ring shape to form a plurality of dams or recesses, and a gap is formed between adjacent ones of the dams or recesses, wherein an arrangement of the plurality of dams or recesses corresponds to positions of the plurality of conductive parts, so that a position of a single dam or recess corresponds to a position of a single conductive part.

2. The substrate structure of claim 1, wherein the packaging area is surrounded by the flow stopper.

3. The substrate structure of claim 1, wherein each of the dams is a protrusion disposed on the first side of the substrate body.

4. The substrate structure of claim 1, wherein each of the dams is a wall-shaped insulator.

5. The substrate structure of claim 1, wherein each of the recesses is formed on the first side of the substrate body.

6. The substrate structure of claim 1, wherein the flow stopper is located at a boundary of the concentrating area and the packaging area.

7. An electronic package, comprising:

a substrate structure including a substrate body and a flow stopper, wherein the substrate body has a first side and a second side opposing the first side, wherein a packaging area, a concentrating area adjacent to the packaging area, and a functional area adjacent to the concentrating area are defined on the first side, wherein the first side has a circuit layer formed thereon, wherein the circuit layer has a plurality of conductive parts located on the functional area, and wherein the flow stopper is disposed on the concentrating area of the first side of the substrate body;

an electronic element disposed on the packaging area of the first side of the substrate body and electrically connected to the circuit layer; and a heat dissipation structure bonded on the electronic element via a heat dissipation material, wherein the heat dissipation material is further formed on the concentrating area.

8. The electronic package of claim 7, wherein the electronic element is electrically connected to the circuit layer via a plurality of conductive bumps.

9. The electronic package of claim 8, further comprising a cladding layer formed on the first side of the substrate body and covering the plurality of conductive bumps.

10. The electronic package of claim 9, wherein the cladding layer is adjacent to the flow stopper.

11. The electronic package of claim 7, wherein the heat dissipation material is used as a thermal interface material.

12. The electronic package of claim 7, wherein the heat dissipation structure is a heat sink.

13. The electronic package of claim 7, wherein the heat dissipation structure comprises a sheet-shaped heat dissipation body and a plurality of supporting legs erected on the heat dissipation body, wherein the heat dissipation body is in contact with and bonded to the heat dissipation material, and the plurality of supporting legs are disposed on the plurality of conductive parts.

14. The electronic package of claim 13, wherein the plurality of supporting legs are disposed on the plurality of conductive parts via a plurality of conductive elements.

15. The electronic package of claim 7, further comprising a plurality of conductive elements disposed on the plurality of conductive parts.

* * * * *